(12) United States Patent
Anderson et al.

(10) Patent No.: US 12,360,176 B2
(45) Date of Patent: Jul. 15, 2025

(54) RESIDUAL CURRENT MONITOR

(71) Applicant: Legrand DPC, LLC, West Hartford, CT (US)

(72) Inventors: Swen Anderson, Limbach-Oberfrohna (DE); William Harold Avery, Jr., Reno, NV (US); Thomas Hsueh, Taipei (TW); Thomas Lauer, Zwickau (DE); Alex Lee, New Taipei (TW); Stefan Oebser, Zwickau (DE); Michael Suchoff, Palm Beach, FL (US)

(73) Assignee: Legrand DPC, LLC, West Hartford, CT (US)

( * ) Notice: Subject to any disclaimer, the term of this patent is extended or adjusted under 35 U.S.C. 154(b) by 0 days.

(21) Appl. No.: 18/466,531

(22) Filed: Sep. 13, 2023

(65) Prior Publication Data

US 2025/0085359 A1  Mar. 13, 2025

(51) Int. Cl.
*G01R 31/52* (2020.01)
*H01R 13/66* (2006.01)

(52) U.S. Cl.
CPC .......... *G01R 31/52* (2020.01); *H01R 13/6683* (2013.01)

(58) Field of Classification Search
CPC .......... G01R 31/51–52; H01R 13/6683; H05K 7/1492
See application file for complete search history.

(56) References Cited

U.S. PATENT DOCUMENTS

| | | | |
|---|---|---|---|
| 4,163,269 A | * | 7/1979 | Helwig, Jr. ............ H02H 3/347 361/45 |
| 4,280,162 A | | 7/1981 | Tanka et al. |
| 4,725,913 A | * | 2/1988 | Dhar ...................... H02H 3/337 361/46 |
| 7,043,543 B2 | | 5/2006 | Ewing et al. |
| 7,368,830 B2 | | 5/2008 | Cleveland et al. |

(Continued)

FOREIGN PATENT DOCUMENTS

| | | | | |
|---|---|---|---|---|
| CN | 112129991 A | * | 12/2020 | ............ G01R 19/10 |
| CN | 212275900 U | * | 1/2021 | |
| EP | 4177621 A1 | * | 5/2023 | ............ B60L 53/30 |

OTHER PUBLICATIONS

"How does residual current monitoring work?" accessed Apr. 8, 2022 from https://www.benderinc.com/know-how/technology/tn-s-tt-system/how-does-residual-current-monitoring-work, 4 pages.

(Continued)

*Primary Examiner* — Lee E Rodak
*Assistant Examiner* — Demetrius R Pretlow
(74) *Attorney, Agent, or Firm* — Michael Henson; Maynard Nexsen PC

(57) ABSTRACT

Disclosed are power distribution systems and methods in which a power distribution unit (PDU) includes a residual current monitor (RCM) to detect the presence of downstream leakage current in the PDU. The RCM can include a current sensor with a core that has power conductors passing through the core and drive windings about the core. Drive circuitry of the RCM produce alternating drive signals through the drive windings to drive the core into and out of positive and negative saturation. Sensing circuitry of the RCM produce a response signal that is filtered by a high-order current signal filter to isolate characteristics of the downstream leakage current.

14 Claims, 17 Drawing Sheets

(56) References Cited

U.S. PATENT DOCUMENTS

| | | |
|---|---|---|
| 7,977,815 B2 | 7/2011 | Ewing et al. |
| 8,305,737 B2 | 11/2012 | Ewing et al. |
| 8,321,163 B2 | 11/2012 | Ewing et al. |
| 8,494,661 B2 | 7/2013 | Ewing et al. |
| 8,694,272 B2 | 4/2014 | Ewing et al. |
| 8,907,678 B2 | 12/2014 | Suchoff |
| 9,201,481 B2 | 12/2015 | Hirosaka |
| 9,411,021 B2 | 8/2016 | Suchoff |
| 9,614,335 B2 | 4/2017 | Irons |
| 9,627,828 B2 | 4/2017 | Irons |
| 9,952,261 B2 | 4/2018 | Ewing et al. |
| 10,249,998 B2 | 4/2019 | Irons et al. |
| 10,498,096 B2 | 12/2019 | Irons et al. |
| 10,677,823 B2 | 6/2020 | Ferguson |
| 10,996,248 B2 | 5/2021 | Ferguson |
| 2003/0034908 A1 | 2/2003 | Nestler et al. |
| 2007/0036212 A1 | 2/2007 | Leung et al. |
| 2008/0180866 A1 | 7/2008 | Wong |
| 2009/0251832 A1* | 10/2009 | Brugner .............. H01R 13/6683 361/103 |
| 2011/0307536 A1* | 12/2011 | Oya ................... H03H 17/0671 708/301 |
| 2013/0289789 A1 | 10/2013 | Ewing et al. |
| 2013/0338844 A1* | 12/2013 | Chan ...................... G05B 13/02 700/286 |
| 2015/0311862 A1* | 10/2015 | Lee .......................... H02H 3/33 702/58 |
| 2017/0354053 A1 | 12/2017 | Irons et al. |
| 2018/0034446 A1 | 2/2018 | Wood |
| 2018/0157284 A1 | 6/2018 | Ewing et al. |
| 2018/0196098 A1* | 7/2018 | Ferguson ................. H02H 3/16 |
| 2019/0148928 A1* | 5/2019 | Oms .................... H02H 1/0015 324/503 |
| 2020/0019220 A1 | 1/2020 | Huang |
| 2020/0195260 A1 | 6/2020 | Sato |
| 2020/0400728 A1 | 12/2020 | Ferguson |
| 2021/0036494 A1 | 2/2021 | Ewing et al. |
| 2021/0288434 A1 | 9/2021 | Ramsey et al. |
| 2021/0313827 A1 | 10/2021 | Pachoud et al. |
| 2022/0037844 A1 | 2/2022 | Irons et al. |
| 2022/0283244 A1* | 9/2022 | Honda ................ H01M 10/425 |
| 2022/0413062 A1* | 12/2022 | Liu .................. G01R 19/16571 |
| 2023/0038103 A1 | 2/2023 | Kinuta |
| 2023/0127478 A1 | 4/2023 | Ferguson |
| 2023/0184812 A1* | 6/2023 | Ferguson ............... G01R 35/00 324/126 |
| 2023/0393638 A1 | 12/2023 | Anderson et al. |

OTHER PUBLICATIONS

Bender GmbH & Co. KG, Residual current monitoring—Product Overview, Jan. 2021, 32 pages.

Raritan, Educational Brief—Residual Current Monitoring, 2018; 2 pages.

Raritan, Residual Current and Neutral Monitoring in the Data Center, White Paper, 12 pages.

International Search Report and Written Opinion for PCT/US2024/046165, dated Nov. 13, 2024.

* cited by examiner

RESIDUAL CURRENT MONITOR

TECHNICAL FIELD

The present disclosure is generally directed to power distribution units, and more specifically, power distribution units that provide methods and systems to detect leakage current.

BACKGROUND

A conventional power distribution unit (PDU) is an assembly of electrical outlets (also called receptacles) that receive electrical power from a source and distribute the electrical power to one or more separate electronic appliances. Each such PDU assembly has a power input that receives power from one or more power sources through a power cord of the PDU. The electrical outlets can be used to provide power to one or more electronic appliances plugged into the PDU outlets. PDUs are used in many applications and settings such as, for example, in or on electronic equipment racks. Leakage current within a PDU is a safety hazard for personnel. Leakage current, especially in high voltage environments, can cause electrocution of personnel, fires, and/or damage to equipment. Due to the dangers of leakage current, many countries are now requiring residual current monitoring to detect leakage current and create an alert to protect personnel and equipment.

BRIEF DESCRIPTION OF THE DRAWINGS

A further understanding of the nature and advantages of the present technology may be realized by reference to the following drawings. In the appended figures, similar components or features may have the same reference label.

DETAILED DESCRIPTION

Figure 1:
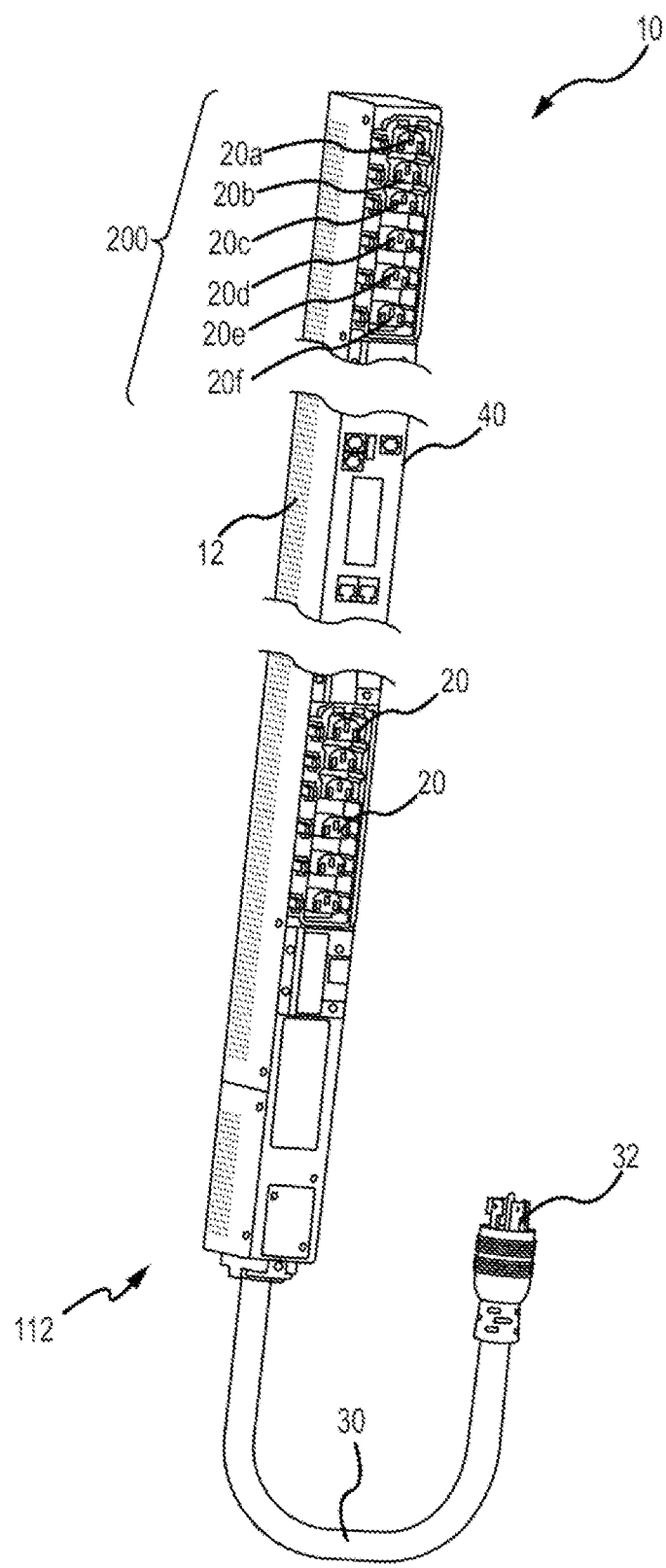
FIG. 1 is an illustration of an example power distribution unit (PDU).

This description provides examples, and is not intended to unnecessarily limit the scope, applicability, or configuration of the invention. Rather, the ensuing description will provide those skilled in the art with an enabling description for implementing embodiments of the invention. Various changes may be made in the function and arrangement of elements. Thus, various embodiments may omit, substitute, and/or add various procedures or components as appropriate. For instance, aspects and elements described with respect to certain embodiments may be combined in various other embodiments. It should also be appreciated that the following systems, devices, and components may individually or collectively be components of a larger system, wherein other procedures may take precedence over or otherwise modify their application.

Embodiments of the disclosed technology are directed to a power distribution unit (PDU) with the capability to detect the presence of downstream leakage/residual, such as leakage current associated with component(s) connected to the PDU, or within the PDU itself. The PDU can include a residual current monitor (RCM) to detect the presence of such downstream leakage current. Power conductors from the input power cord of the PDU may be passed through the center of a core (e.g., annular ferromagnetic core susceptible to magnetization) associated with the RCM. The core may include a pair of drive windings, which are wound circumferentially around the core such that the flux generated by the first drive winding is opposite to the flux generated by the second winding. This can be accomplished, for example, by winding them in opposite directions. Drive circuitry of the RCM can produce alternating drive signals through the drive windings to drive the core into and out of positive and negative saturation. The RCM includes sensing circuitry that produces a response signal that may be filtered by a high-order current signal filter to isolate characteristics of the downstream leakage current. The RCM can detect the presence of leakage current in the response signal based on characteristics of the response signal. For example, the response signal has a 50/50 duty cycle in the absence of leakage current and a non-50/50 duty cycle or a change in amplitude in the presence of leakage current. Terms "leakage" and "residual" are sometimes used interchangeably. In a preferred embodiment, current that does not return through the system is referred herein as leakage current and the devices used to monitor the leakage current are referred herein as residual current monitors. While the present disclosure is described in the context of a power distribution unit (PDU) typically found in cabinets within data centers, the ordinarily skilled artisan will appreciate that these teachings for detecting residual current can be extended to other types of power distribution systems such as transfer switches, tap boxes for overhead busway systems or even within the power cords themselves. Thus, the RCM as described herein can be applied to any device or application that needs to detect residual current and can benefit from the teachings herein.

Shown in FIG. 1 is an illustrative embodiment of a PDU 10 that includes a housing 12 with a plurality of outlets 20 (also called "receptacles", "outputs", "electrical outlets" or "power outlets") mounted therein to supply power to individual assets or devices, for example, assets that are used in operation of a data center. The assets may be mounted into an equipment rack and appropriately plugged into one of the outlets 20 of the PDU. Accordingly, the PDU 10 can be configured for mounting vertically or horizontally. To supply and distribute power to the connected assets through the outlets 20, the PDU 10 has a power input. As shown, the PDU can include an internally wired input power cord 30 that extends externally and terminates with an associated plug 32 for connection to a power source in a traditional plug and receptacle connection. Alternatively, the PDU 10 can include a detachable power cord, or be internally hard wired to the external power source. The PDU 10 can include a visual display portion 40 to display monitored information, for example, an indication of which outlet of the PDU has detected leakage current. The visual display can display other information such as, for example, power consumption, voltage, and/or current on a per outlet basis. Alternatively, or additionally, the PDU 10 can be coupled to an external display to convey such information. The outlets 20 can be grouped and configured to define one or more outlet modules 200, each having a selected number and configuration of outlets, such as outlets 20a-20f. The input to the PDU, one or more of its outputs, or one or more of its intelligent power modules, may be configured with a residual current monitor as described herein.

Figure 2:
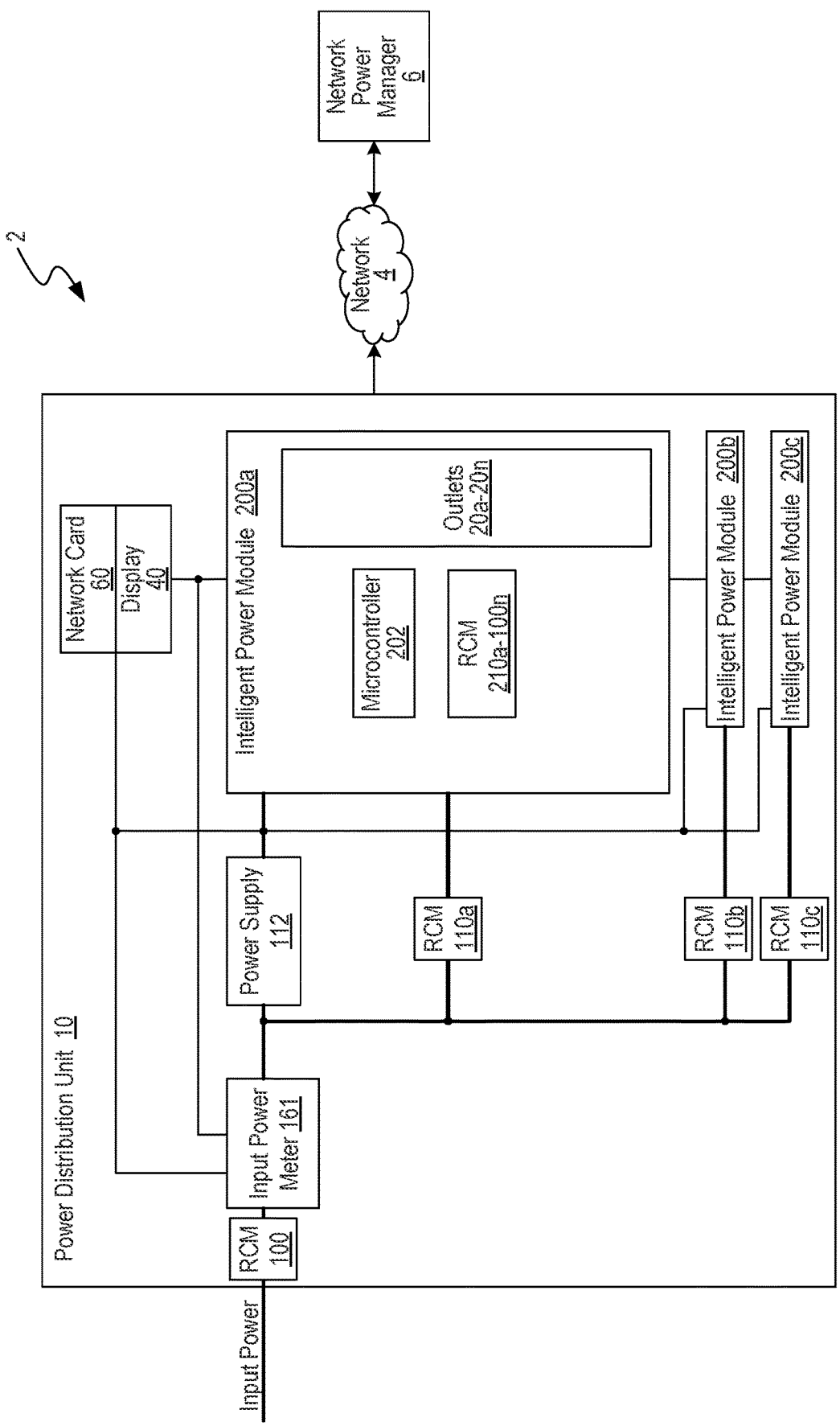
FIG. 2 is a partial block wiring diagram of the PDU of FIG. 1 connected to a power input and network.

Shown in the block diagram of FIG. 2 is an illustrative system 2 that includes the preferred PDU 10 to supply power to one or more associated computing assets, such as for example, devices of a computing network 4. The PDU 10 can communicate over the computer network 4 with a data center operator or a networked application such as, for example, a power manager application 6. As schematically shown, an outlet intelligent power module (IPM) 200 of the PDU 10 may be wired and configured with a residual current monitoring (RCM) circuit 210a-210n that detects or determines leakage current for each outlet 20a-20n of the modules 200a-200c. The microcontroller 202 is preferably configured to communicate detection of a leakage current to the display 40 or otherwise communicate a leakage current to a networked device or operator over the network 4 to address the issue with appropriate personnel. In a preferred embodiment the IPM microcontroller 202 communicates residual current information to the network interface card 60. The network interface card 60 communicates the residual current information to the display 40.

Accordingly, the PDU 10 preferably includes a network interface card 60 for communication with devices on the network 4 and can also be configured for internal communication between modules 200 of the PDU 10. In addition, the PDU can include an input power meter 161 with an upstream RCM 100, as illustratively shown, or a downstream RCM 110a-110c at the input of each intelligent power module 200a-200c. The bolded power lines can illustrate high voltage lines while the non-bolded lines can illustrate low voltage lines.

Figure 3:
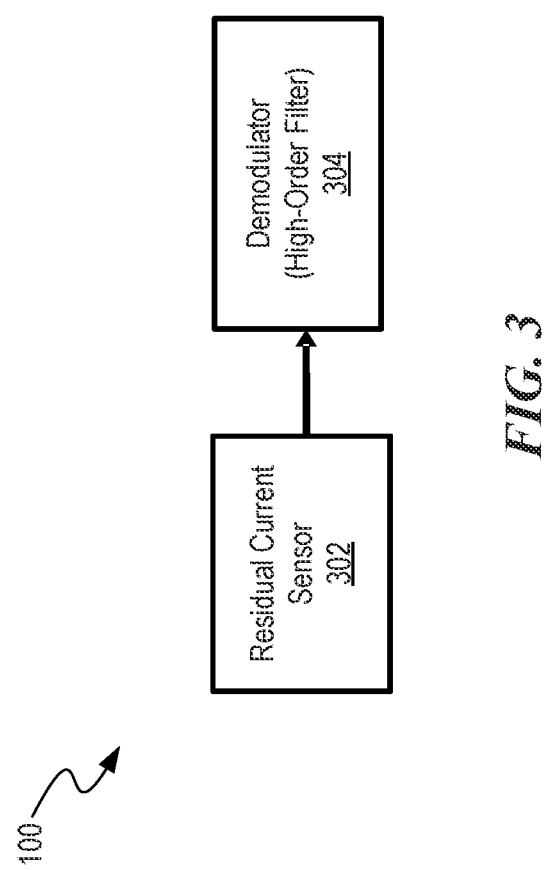
FIG. 3 illustrates a diagram of a residual current monitor (RCM) circuit that includes a residual current sensor and a demodulator.

FIG. 3 illustrates a block diagram of an RCM circuit 100 that includes a residual current sensor 302 and a demodulator 304. The residual current sensor 302 detects leakage current in a PDU and a response signal of the leakage current is passed through a demodulator 304 (e.g., a high-order current signal filter). The demodulator 304 filters the response signal to isolate characteristics of the leakage current. The response signal can include a high frequency carrier signal (e.g., 5 kHz) and a low frequency leakage current signal. The demodulator 304 can separate out the high frequency carrier signal from the low frequency leakage current signal.

Figure 4A:
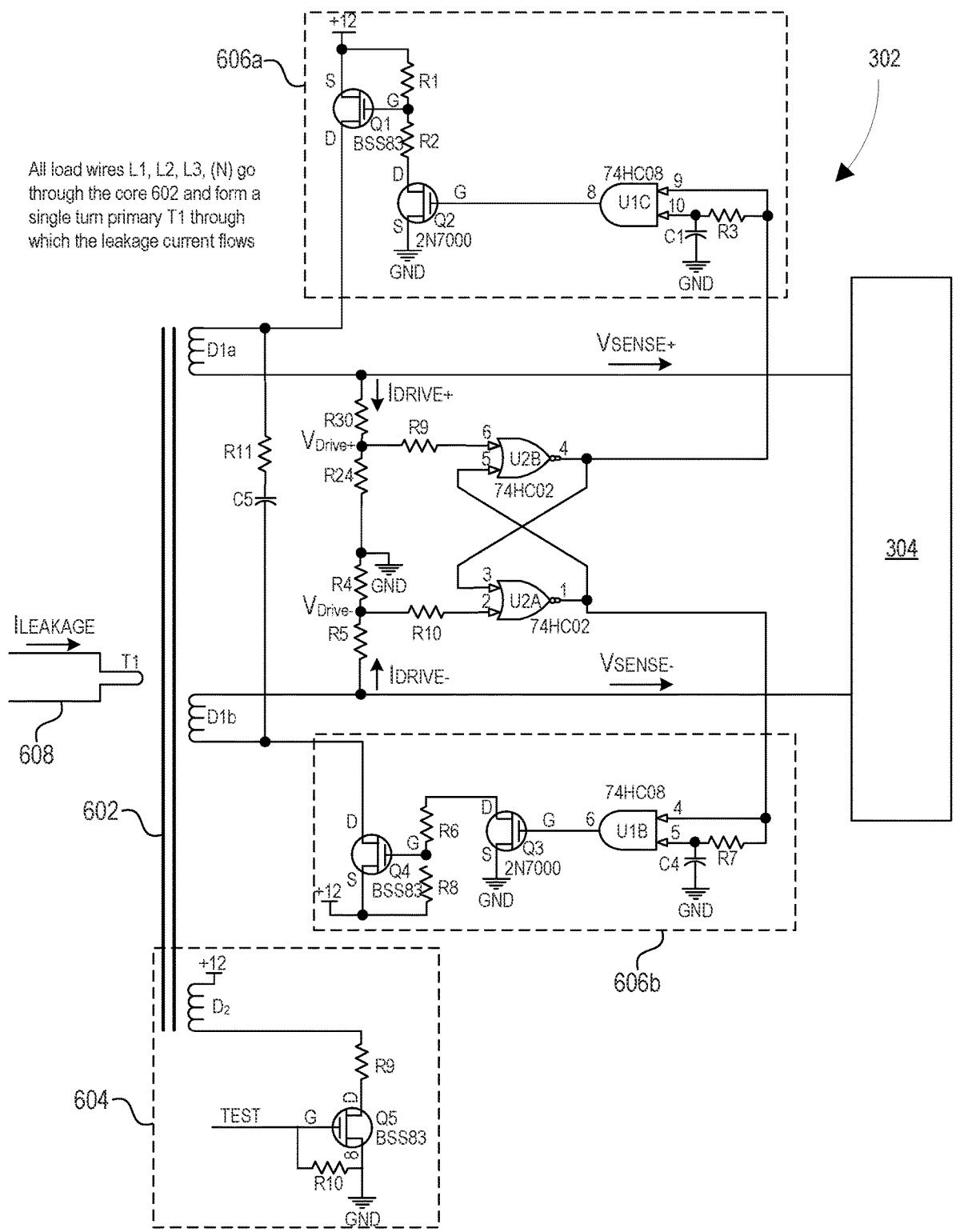
FIG. 4A illustrates a circuit schematic of a residual current sensor to detect leakage current in a PDU.

FIG. 4A illustrates a circuit schematic of residual current sensor 302 to detect leakage current in a system under test, such as PDUs. In a preferred embodiment, power conductors 608 from the input power cord of a PDU are passed through the center (not shown) of a toroidal core 602 (e.g., annular ferromagnetic core). All load wires, such as, L1, L2, L3, and neutral wires, pass through (not shown) the toroidal core 602 to form a single turn primary through which the leakage current ($I_{Leakage}$) flows. In a 3-phase delta power input L1, L2 and L3 pass through the toroidal core 602. In a 3-phase wye power input L1, L2, L3 and N pass through the toroidal core 602. Leakage current is sourced through the load wires but does not return through the load wires. Instead, the leakage current travels through a secondary path (e.g., human body) to earth ground. The residual current sensor 302 detects whether there is leakage current, in the return path of the PDU to determine the amount of leakage current in the system under test. The leakage current can be DC, AC, or DC and AC.

The toroidal core 602 can include a pair of drive windings D1a and D1b, which are wound circumferentially around the toroidal core 602 such that the flux generated by the first drive winding is opposite to the flux generated by the second winding. The drive windings D1a and D1b are wound around the toroidal core 602 with a selected number of turns within a range, for example, on the order of 40 to 80. In some embodiments, the residual current sensor 302 includes a test circuit 604 which includes a test winding D2 wound around the toroidal core 602 with a selected number of turns within a range, for example, on the order of 20 to 30. The test circuit 604 can include an arrangement of resistors R9 and R10 and a field effective transistor (FET) circuit Q5. The test circuit 604 verifies that the residual current sensor 302 is working properly by applying a test current value (e.g., equivalent to 20 mA) on the toroidal core 602 and verifying that the output from the demodulator 304 is the same current value. The test circuit 604 can perform the test at start up or periodically. The result of the test signal of test circuit 604 can be transmitted over the network interface.

The residual current sensor 302 can include drive circuitry 606a and 606b that is operative to produce alternating drive signals through the drive windings D1a and D1b, respectively, to drive the toroidal core 602 into and out of positive and negative saturation. Drive circuit 606a can include FETs Q1 and Q2, resistors R1, R2, and R3, AND gate U1C and capacitor C1. Drive circuit 606b can include FETs Q3 and Q4, resistors R6, R7, and R8, AND gate U1B and capacitor C4. The flip-flop circuits U2B and U2A, RC couplings C4/R7 and C1/R3, and AND gates U1C and U1B ensure that only one drive circuit is energized at any given time by adding a delay between the oscillating operation of the drive circuits 606a and 606b. R11 and C5 are connected is series between drive windings D1a and D1b to absorb the current in a voltage spike that may result from drive circuits 606a or 606b alternating. By absorbing the voltage spike, R11/C5 prevents the spike from damaging the FETs Q1, Q2, Q3, and Q4 in the drive circuits 606a or 606b.

As a voltage (e.g., 12V) is applied to a drive circuit (e.g., drive circuit 606a), via one or more voltage regulators (not shown), the current increases until the toroidal core 602 begins to enter positive saturation. As the core goes deeper into saturation, the flip-flop U2B and U2A turn OFF the drive circuit 606a and turn ON the alternate drive circuit 606b (e.g., to avoid the core going into full saturation). In a first example, as the drive current ($I_{Drive+}$) from drive circuit 606a is applied across the voltage divider circuit of resistors R24 and R30, the drive voltage ($V_{Drive+}$) increases until the voltage across R24 reaches a threshold (e.g., 1.65V). Once the voltage across R24 reaches the threshold (e.g., indicating the toroidal core 602 has entered deeper positive saturation), the flip-flop U2A and U2B switch the input to the drive current ($I_{Drive-}$) from drive circuit 606a, and the drive current ($I_{Drive-}$) from the drive circuit 606b is then applied across the voltage divider circuit of resistors R4 and R5, until the voltage across R5 reaches a threshold (e.g., 1.65V). Once the voltage across R5 reaches the threshold (e.g., indicating the toroidal core 602 has entered negative saturation), the flip-flop U2B and U2A switch the input to the drive current ($I_{Drive+}$) from drive circuit 606b to drive circuit 606a, and the entire cycle repeats. The residual current sensor 302 can include suitable capacitors (not shown) throughout the circuit to keep the voltage constant at various locations in the circuit. Additionally, bypass capacitors (not shown) can be located near each microchip (e.g., U1C, U2B, U2A, and U1B) in the circuit to maintain a constant voltage.

An analog current signal ($I_{sense}$) associated with the sense voltage ($V_{sense}$) from each drive circuit 606a and 606b, corresponds to the current waveform through the combination of drive current ($I_{DRIVE}$) and the analog leakage signal ($I_{LEAK}$). As such, ($I_{sense}$)=($I_{DRIVE}$)+($I_{LEAK}$). These analog current signals allow the voltage signal ($V_{sense+}$) to be derived at the tap point between the drive coil D1a and resistor R30, and the voltage signal ($V_{sense-}$) to be derived at the tap point between the drive coil D1b and resistor R5. In the absence of any leakage current ($I_{LEAK}$) on the power conductors passing through the core 602, $V_{sense+}$ and $V_{sense-}$ are equal and opposite and sum to zero. However, the presence of a leakage current ($I_{LEAK}$) in either direction will have an additive or subtractive effect on the total current passing through the system. That is, leakage current ($I_{LEAK}$) causes one of the two sense voltages ($V_{sense+}$ and $V_{sense-}$) to become larger and the other smaller due to the AC component or DC offset of the residual current (or both) so that they no longer sum to zero.

The demodulator 304 receives the output response signal of the voltage signals ($V_{sense+}$) and ($V_{sense-}$) from the residual current sensor 302 and filters the response signal. The presence of leakage current ($I_{LEAK}$) will affect the duty cycle and/or amplitude of the response signal. For example, the response signal has a symmetrical positive and negative amplitude and a 50/50 duty cycle in an absence of leakage current ($I_{LEAK}$) and a nonsymmetrical positive and negative amplitude and/or a non-50/50 duty cycle in the presence of leakage current ($I_{LEAK}$). A measurement of the change in amplitude of the response signal can indicate the amount of leakage current.

Figure 5A:
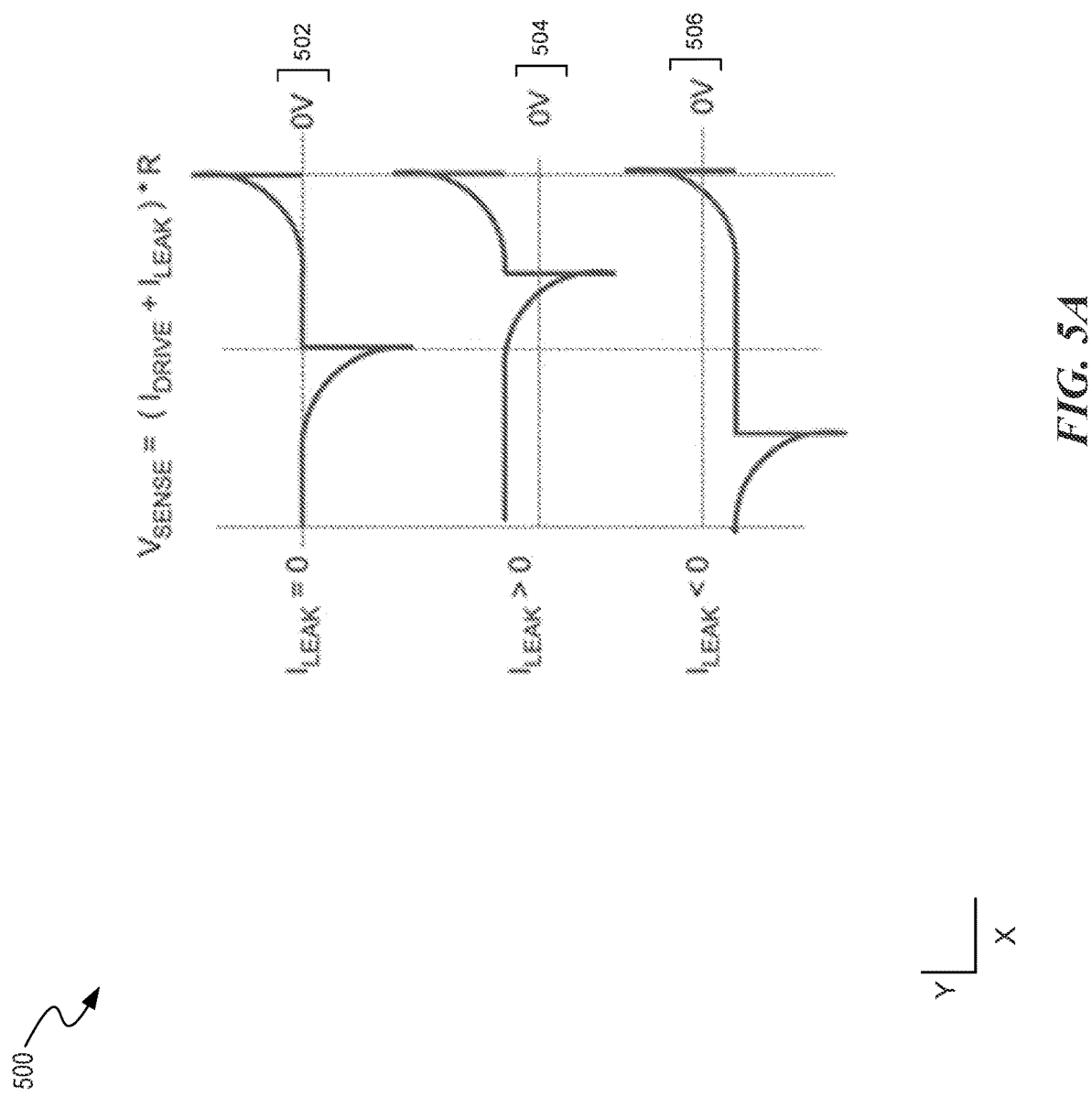
FIG. 5A illustrates representative sense voltage response signals based on the presence or absence of leakage current.

Graph 500 of FIG. 5A illustrates an example of the duty cycle of a sense voltage response signal when the leakage current is equal to zero, greater than zero, or less than zero. At 502, the 50/50 duty cycle indicates that the core is reaching the edge of saturation at the same rate from drive circuit 606a and 606b. At 502, the graph illustrates that there is no leakage current detected in the system under test. When the leakage current is zero the duty cycle is symmetrical and the rising and falling portions of the waveform are the same length.

At 504, the non 50/50 duty cycle illustrates that the leakage current is greater than zero and in this case is bucking the generated flux, the toroidal core 602 takes longer to reach saturation. As illustrated, a DC bias voltage from the leakage current increases the starting voltage level of the duty cycle to above zero volts. At 504, the graph illustrates that there are both AC and DC leakage currents detected in the system under test. When the leakage current is positive, the duty cycle waveform is shifted upwards from the x axis. For example, the rising portion of the waveform is 1% longer and the falling portion of the waveform is 1% shorter.

At 506, the non 50/50 duty cycle illustrates that the leakage current is less than zero and, in this case, aids the generated flux so that the toroidal core 602 takes less time to reach saturation. As illustrated, a DC bias voltage from the leakage current increases the starting voltage level of the duty cycle to below zero volts. At 506, the graph illustrates that there are both AC and DC (opposite direction as the DC current in 504) leakage currents detected in the system under test. When the leakage current is negative, the duty cycle waveform is shifted downwards from the x axis. For example, the rising portion of the waveform is 1% shorter and the falling portion of the waveform is 1% longer.

Figure 5B:
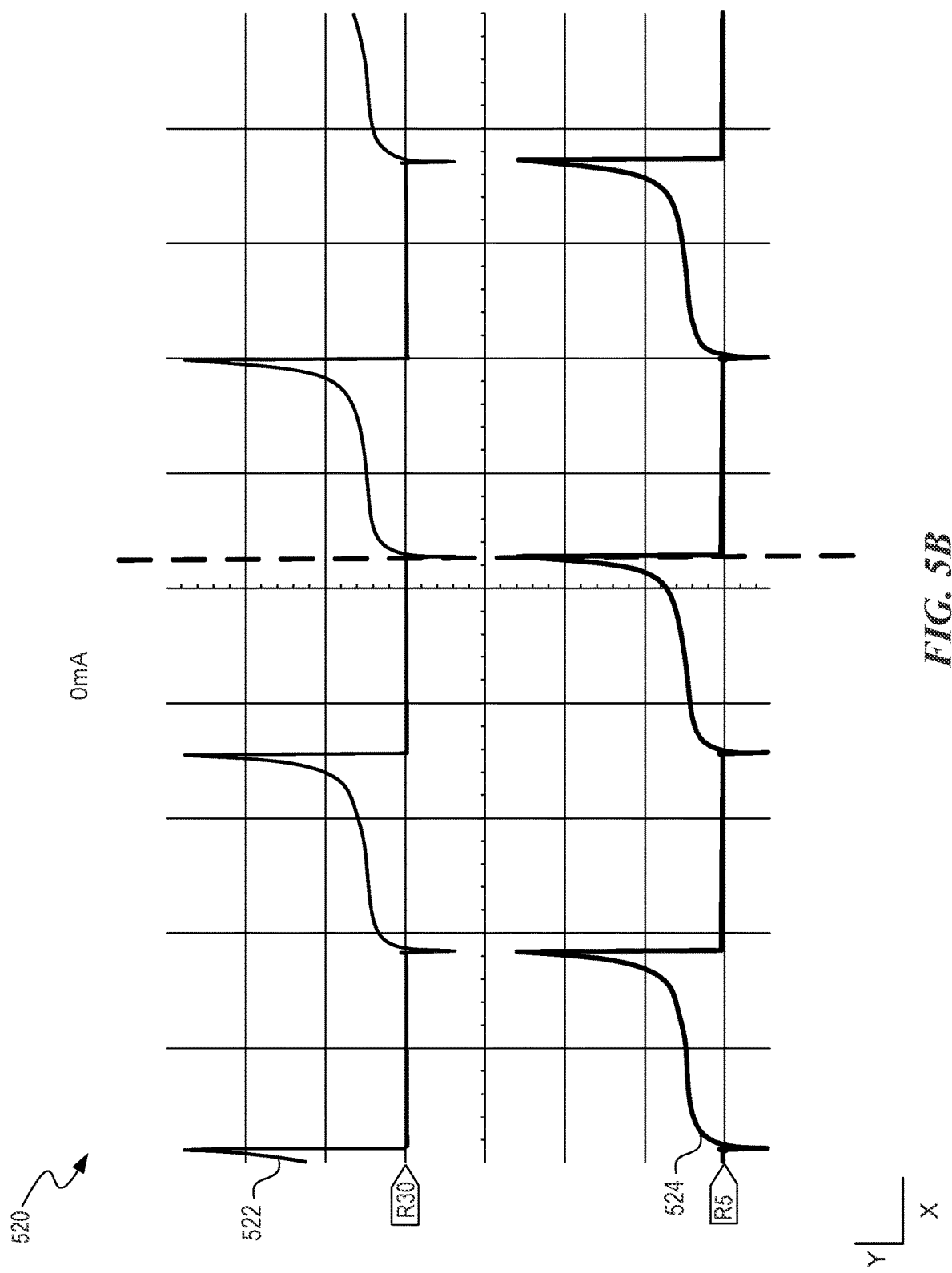
FIG. 5B illustrates representative voltage waveforms that depict no leakage current in a PDU.

FIG. 5B illustrates representative voltage waveforms 520 that depict no leakage current in a PDU. Waveform 522 illustrates the voltage measured at the top of R30 of FIG. 4A. Waveform 524 illustrates the voltage measured at the bottom of R5 of FIG. 4A. The voltage waveforms 520 illustrate a variation in inductance of the core, reverse injection of current during switching, and the residual magnetism of the core material itself. When the leakage current is zero the amplitude of waveforms 522 and 524 is unchanged.

Figure 5C:
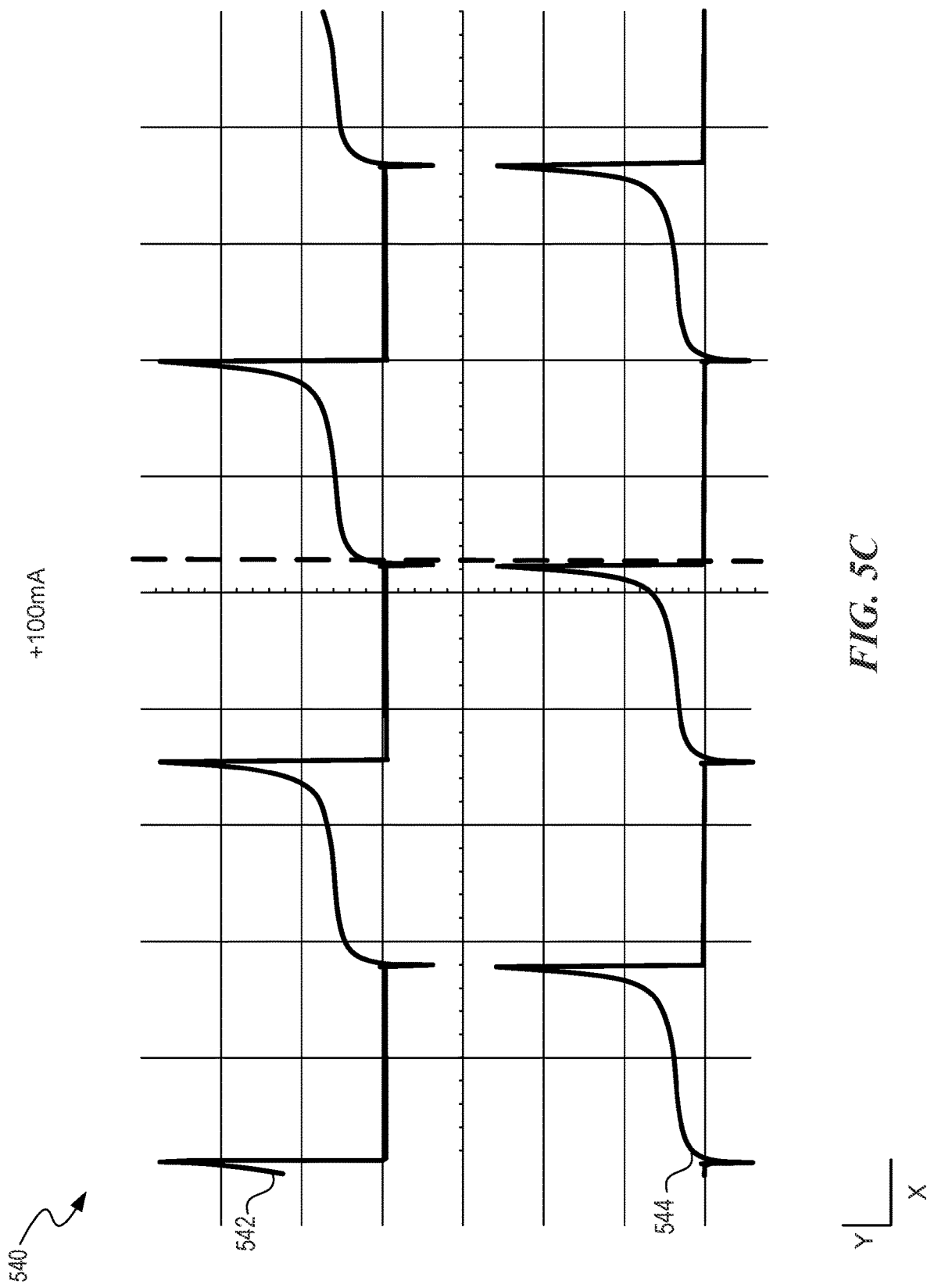
FIG. 5C illustrates representative voltage waveforms that depict positive leakage current in a PDU.

FIG. 5C illustrates representative voltage waveforms 540 that depict positive leakage current in a PDU. Waveform 542 illustrates the voltage measured at the top of R30 of FIG. 4A. Waveform 544 illustrates the voltage measured at the bottom of R5 of FIG. 4A. The voltage waveforms 540 illustrate a variation in inductance of the core, reverse injection of current during switching, and the residual magnetism of the core material itself. Note that if the leakage current is positive (e.g., +100 mA) the waveforms 542 and 544 are shifted upwards from the x-axis and left of the y-axis. Additionally, the amplitude of the waveforms 542 and 544 is increased (in relation to waveforms 522 and 524 of FIG. 5B) which indicates the presence of positive leakage current.

Figure 5D:
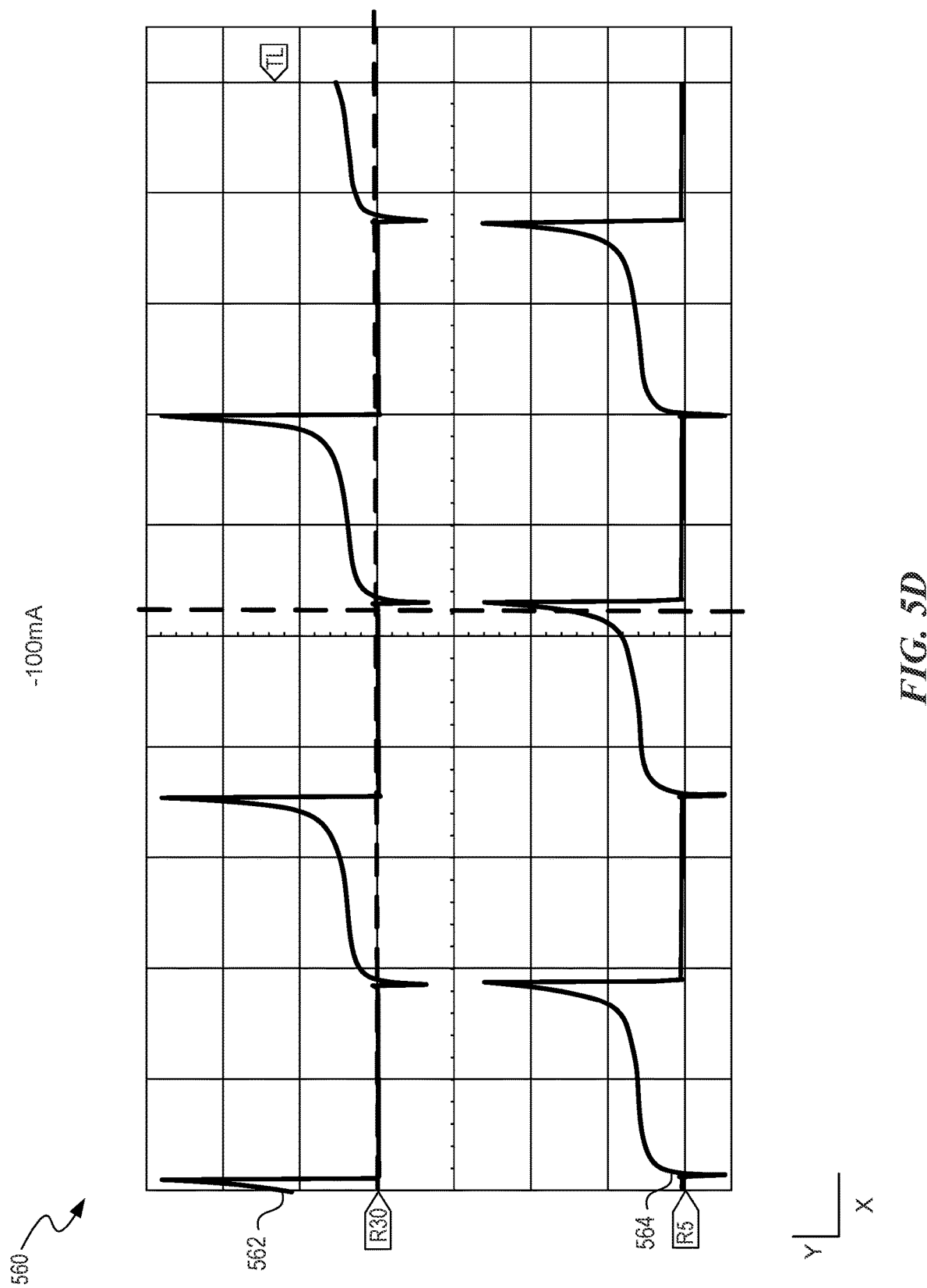
FIG. 5D illustrates representative voltage waveforms that depict negative leakage current in a PDU.

FIG. 5D illustrates representative voltage waveforms 560 that depict negative leakage current in a PDU. Waveform 562 illustrates the voltage measured at the top of R30 of FIG. 4A. Waveform 564 illustrates the voltage measured at the bottom of R5 of FIG. 4A. The voltage waveforms 560 illustrate a variation in inductance of the core, reverse injection of current during switching, and the residual magnetism of the core material itself. Note that if the leakage current is negative (e.g., −100 mA) the waveforms 562 and 564 are shifted downwards from the x-axis and right of the y-axis. Additionally, the amplitude of the waveforms 562 and 564 is decreased (in relation to waveforms 522 and 524 of FIG. 5B) which indicates the presence of negative leakage current.

Figure 4B:
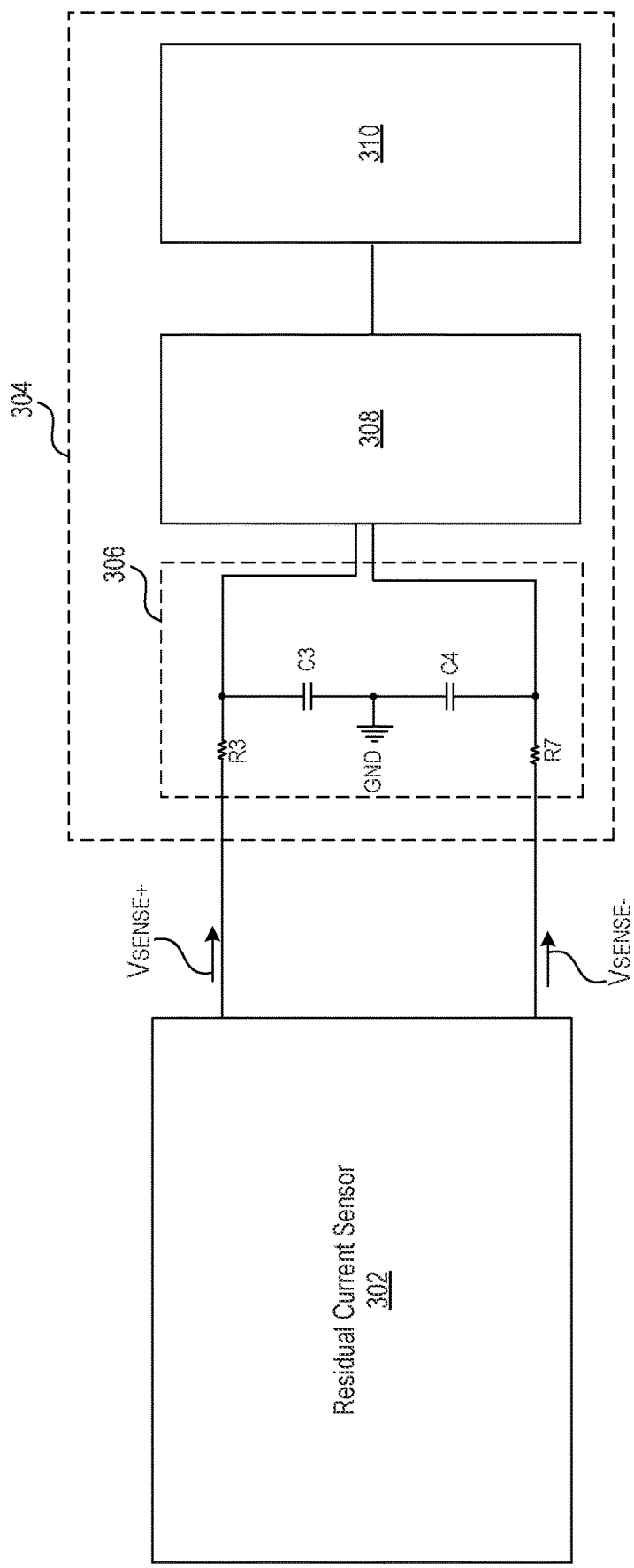
FIG. 4B illustrates a diagram of an RCM circuit that includes a residual current sensor, an RC filter, an ADC, and a Chebyshev low-pass filter.

FIG. 4B illustrates a diagram of an RCM circuit that includes a residual current sensor 302, a resistor-capacitor (RC) filter 306, an A to D converter (ADC) 308, and a Chebyshev low-pass filter 310. A preferred embodiment is a Chebyshev filter, however any high order low-pass filter can be used). As previously described in FIG. 4A, the residual current sensor 302 detects leakage current present in a PDU, or associated with components attached to the PDU, and initially passes a response signal of the voltage signals ($V_{sense+}$) and ($V_{sense-}$) to an RC filter (e.g., active or passive filter) of demodulator 304. The RC filter 306 can include capacitors C3 and C4, and resistors R3 and R7. RC filter 306, ADC 308, and Chebyshev low-pass filter 310 each filter the response signal to isolate characteristics of the leakage current. Additional details regarding the filtering process are provided below in FIG. 6.

Figure 6:
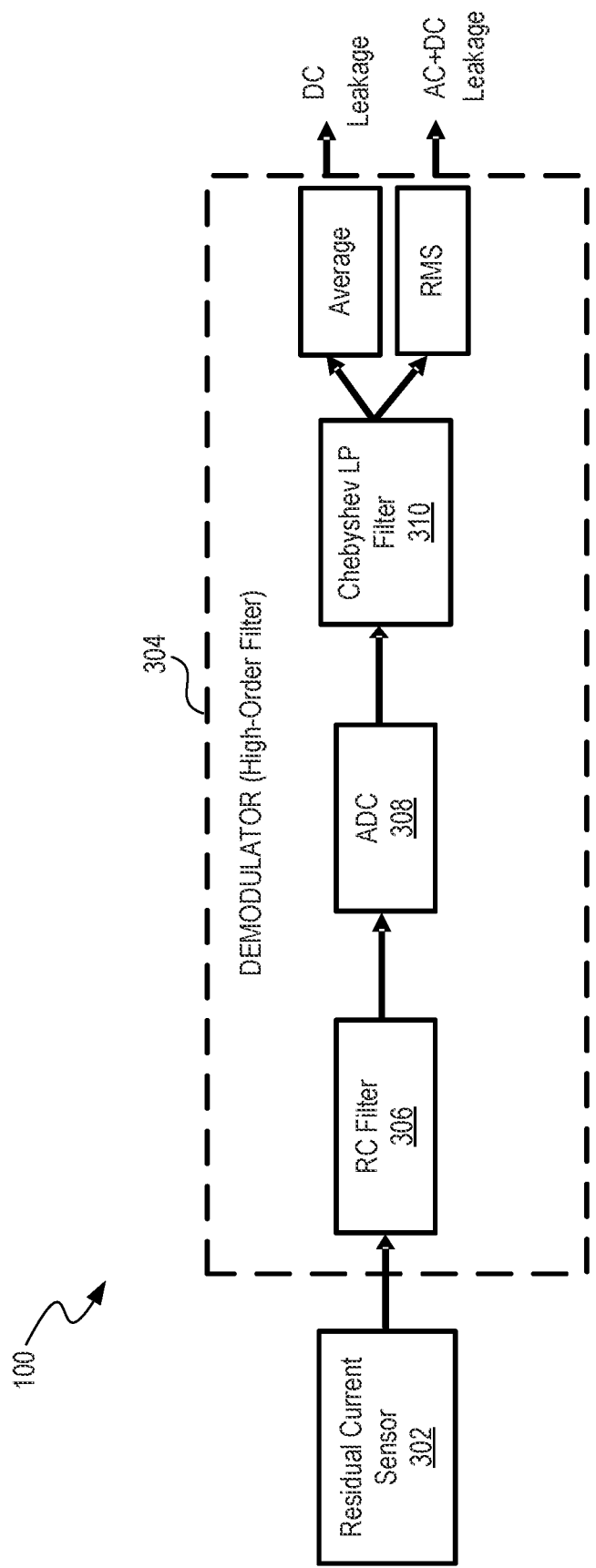
FIG. 6 illustrates a diagram of the RCM circuit which depicts a more detailed representation of a demodulator.

FIG. 6 illustrates a diagram of the RCM circuit 100 which depicts a more detailed representation of demodulator 304. In a preferred embodiment, the demodulator 304 is a digital low-pass filter which incorporates digital signal processing (DSP) and operates in the frequency domain. More particularly, the demodulator 304 is a high order filter (e.g., at least a 3rd order filter). Since the carrier signal of the residual current signal is at approximately 5 kHz and the AC and DC residual current components of the RCM sensor signal are typically between 0 and 1-2 kHz, it is necessary for the demodulator 304 to eliminate the carrier signal to derive the actual residual current signal.

Figure 7:
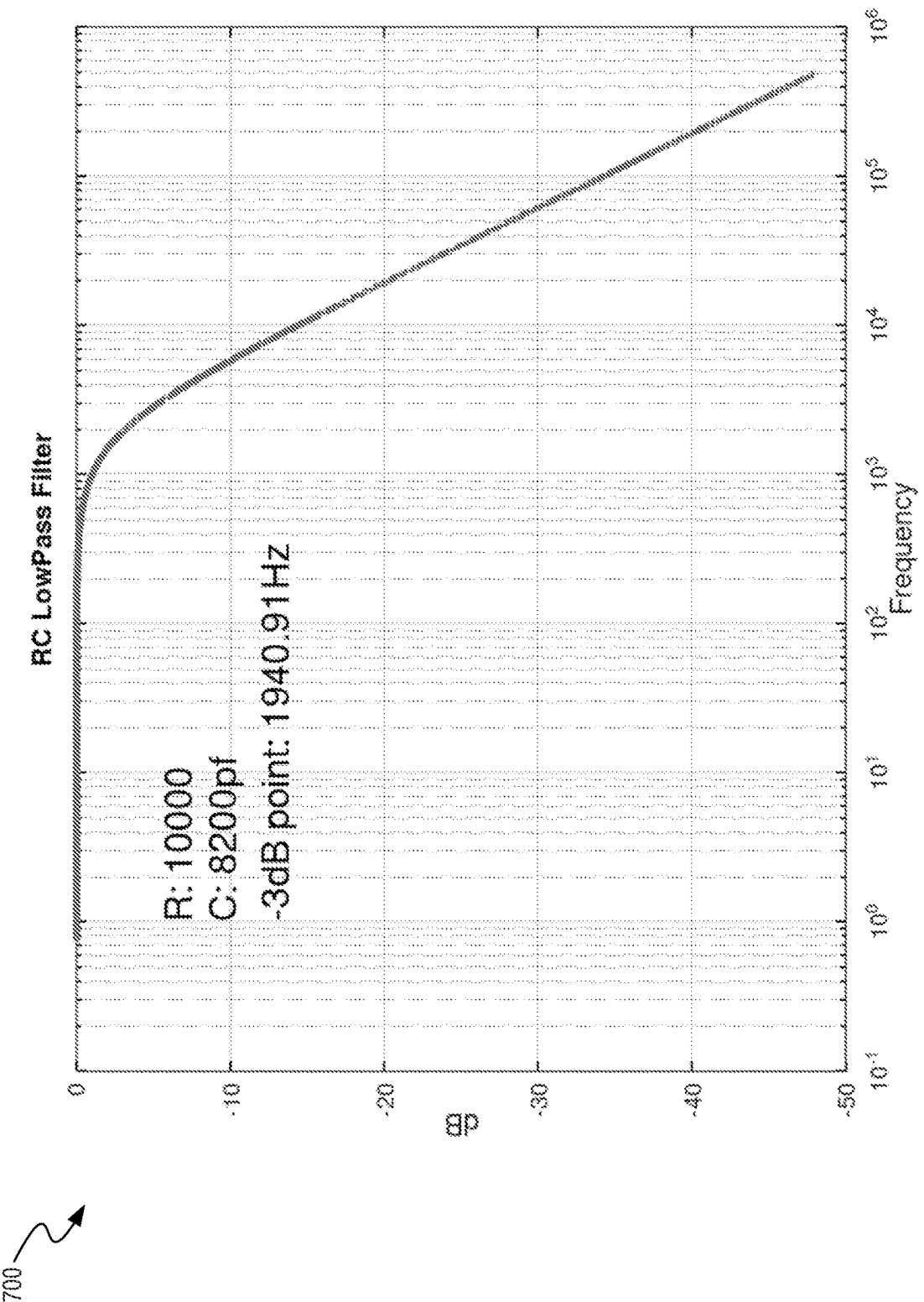
FIG. 7 illustrates an example of a filtered residual current signal after passing through a RC low-pass filter.

The demodulator 304 can include three stages: an RC filter 306, an ADC 308, and a Chebyshev low-pass filter 310. The first stage of the demodulator is an RC filter 306 used to eliminate very high frequency components (e.g., above 2 kHz). As shown in FIG. 4B, the RC filter 306 can be a single pole RC lowpass filter, preferable with a cutoff frequency at approximately 2 kHz which when combined with a 6 pole digital filter form a 0.5 dB Chebyshev filter with a cut off frequency of 2.5 KHz (e.g., to block very high frequencies from causing aliasing when sampled by an ADC). Graph 700 of FIG. 7 illustrates an example frequency response of RC filter 306 which reflects the attenuation applied to the residual current signal as a function of frequency. The RC filter 306 works with the Chebyshev low-pass filter 310 to attenuate the 5 kHz carrier signal and its higher order harmonics. For example, RC filter 306 works with the Chebyshev low-pass filter 310 to attenuate at least 60 dB to achieve a 0.6 mA RCM noise floor. In some cases, for optimum performance the required attenuation is 75 dB.

Figure 8:
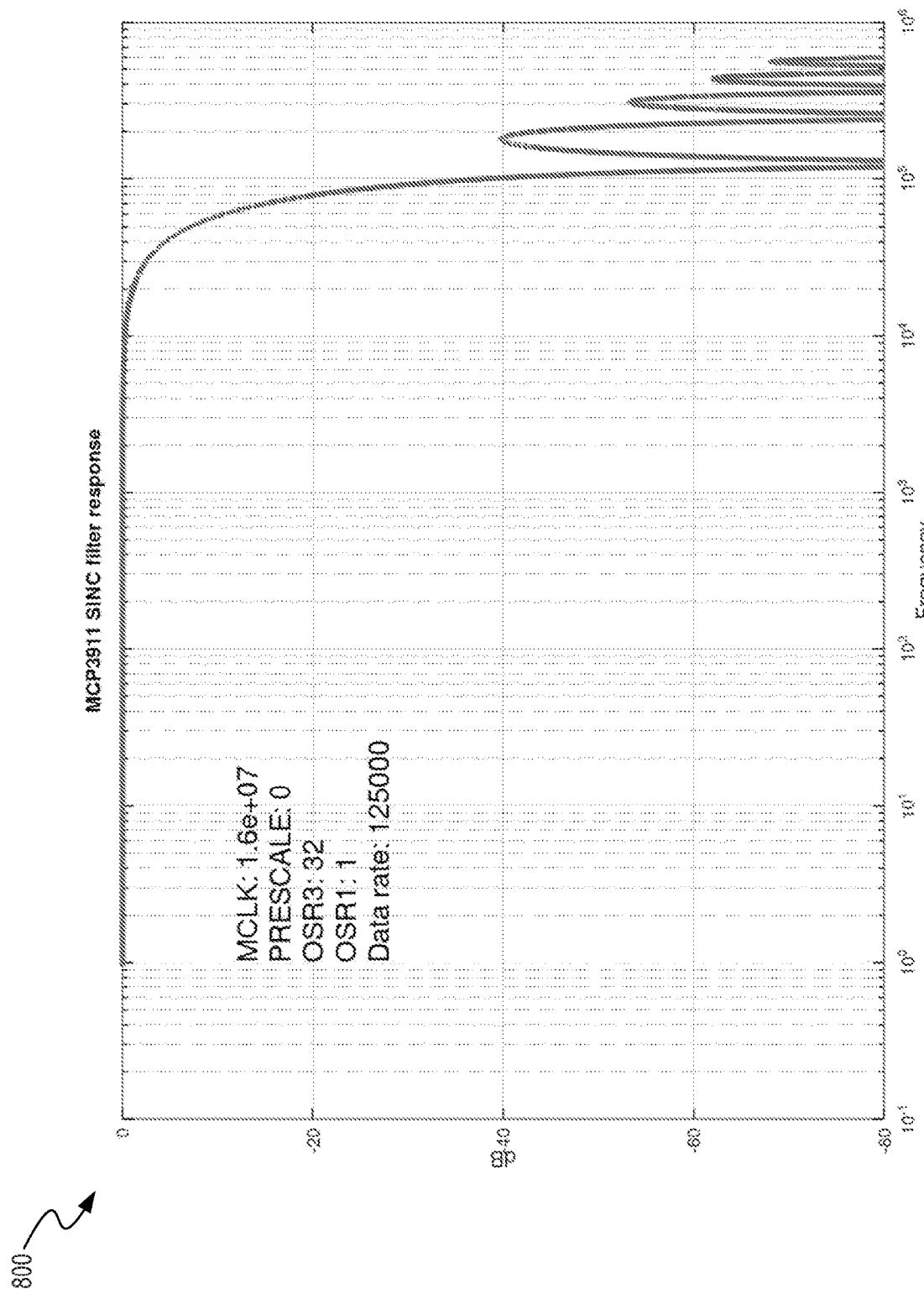
FIG. 8 illustrates an example of a filtered residual current signal after passing through a SINC filter.

In the second stage of the demodulator 304, the filtered signal from the RC filter 306 is passed to an ADC 308 which may incorporate a programmable SINC filter to eliminate other high frequency components. ADC may be Part No. MCP3911A0T-E/ML available from Microchip Technology. The demodulator 304 can include resistors and capacitors (not shown) that eliminate extraneous noise and to ensure the digital supply voltage(s) remain constant (e.g., 3.3 VDC) for the ADC 308. The SINC filter can be configured to pass all signals 0-2 KHz with no attenuation and to operate at a 125 k samples/sec. data sample rate. Graph 800 of FIG. 8 illustrates an example frequency response of the SINC filter.

Figure 9:
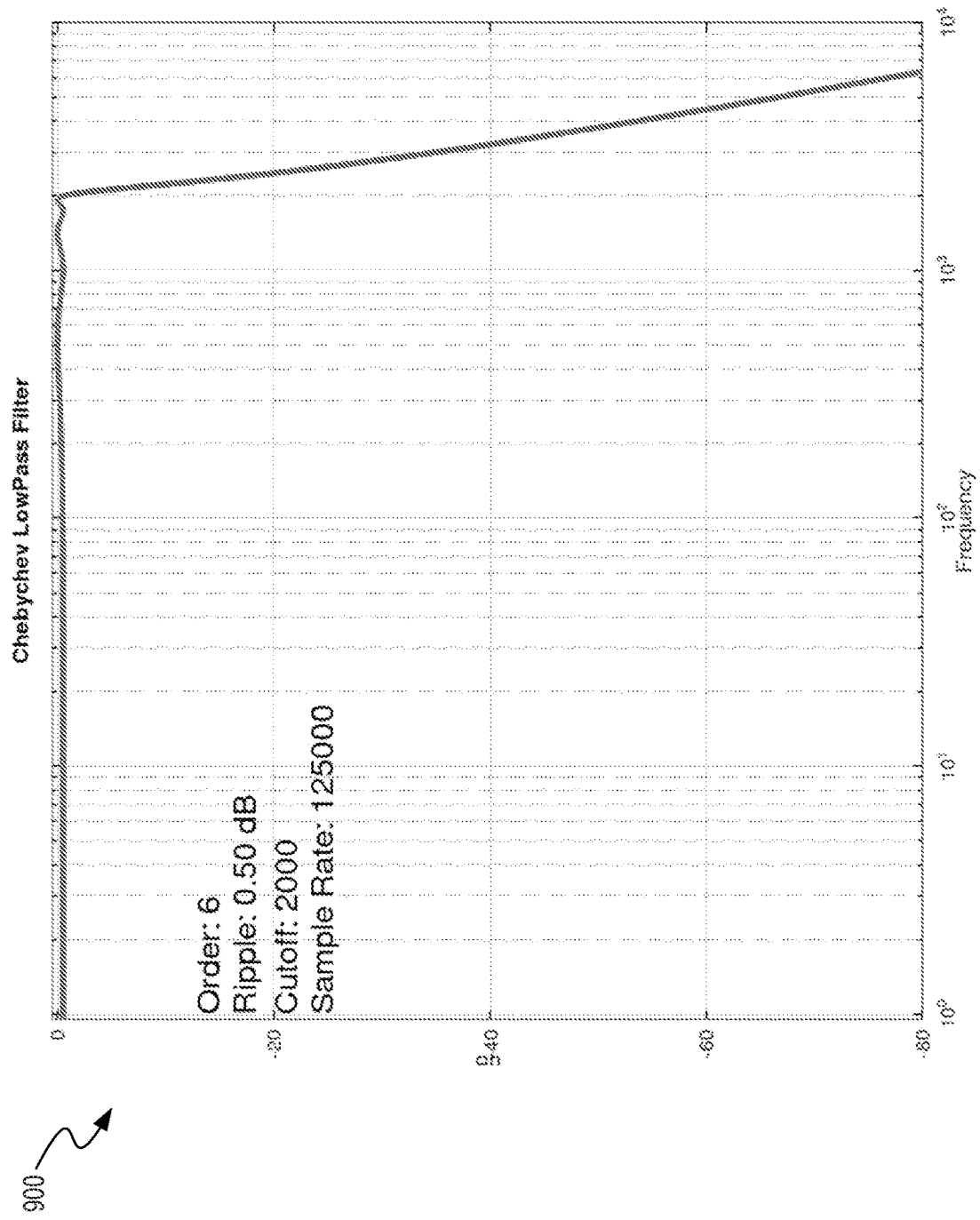
FIG. 9 illustrates an example of a filtered residual current signal after passing through a Chebyshev low-pass filter.

In the third stage of the demodulator 304, a Chebyshev low-pass filter 310 receives the filtered response signal from the ADC 308 via a Serial Peripheral Interface (SPI) bus to support high speed communications between the ADC 308 and the Chebyshev low-pass filter 310. The Chebyshev low-pass filter 310 is implemented through firmware (e.g., STM32 microcontroller firmware) to eliminate all the remaining high frequency components. For example, the Chebyshev low-pass filter 310 may be a 6th order lowpass filter, which when combined with the RC filter in hardware forms a 7 pole filter with a cutoff frequency of 2.5 KHz. The Chebyshev low-pass filter 310 can pass signals less than or equal to 2 kHz and attenuates signals greater than 2 kHz. The passband of the Chebyshev low-pass filter 310 may have a 0.5 dB ripple and attenuates greater than 75 dB for signals greater than or equal to 5.6 kHz. Graph 900 of FIG. 9 illustrates an example frequency response of a Chebyshev low-pass filter 310. In some embodiments, the Chebyshev low-pass filter 310 is a microcontroller that can communicate with external devices (not shown).

Figure 10:
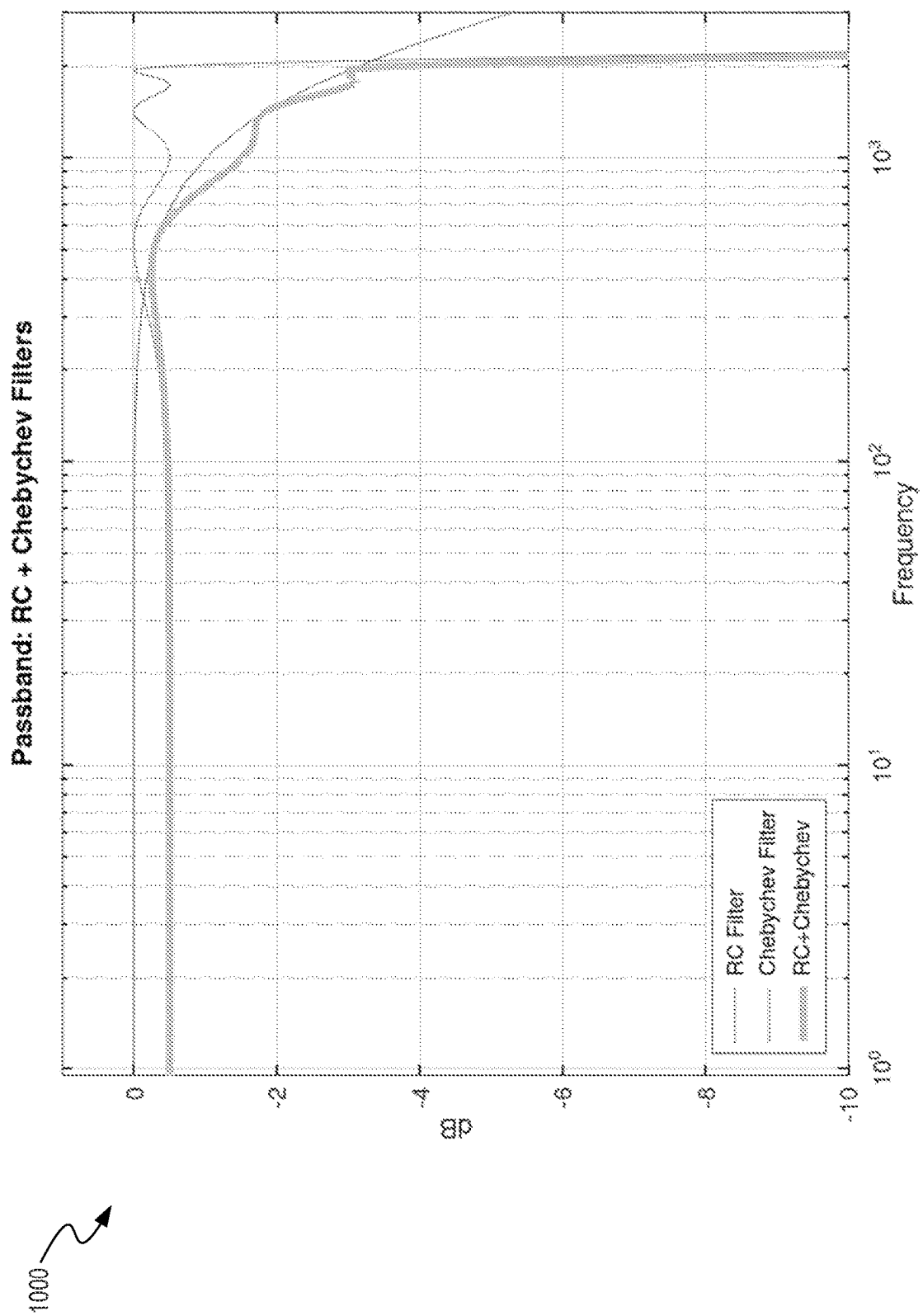
FIG. 10 illustrates an example of a filtered residual current signal after passing through an RC filter followed by a Chebyshev low-pass filter.

Graph 1000 of FIG. 10 illustrates an example of a filtered residual current signal after passing through the RC filter 306 and Chebyshev low-pass filter 310. The RC/Chebyshev filter forms a 7th order lowpass filter, has a passband of 0-2 kHz, a cutoff frequency of 2.5 kHz, and has a stopband on the order of 75 dB attenuation for signals greater than or equal to 5 kHz.

Figure 11:
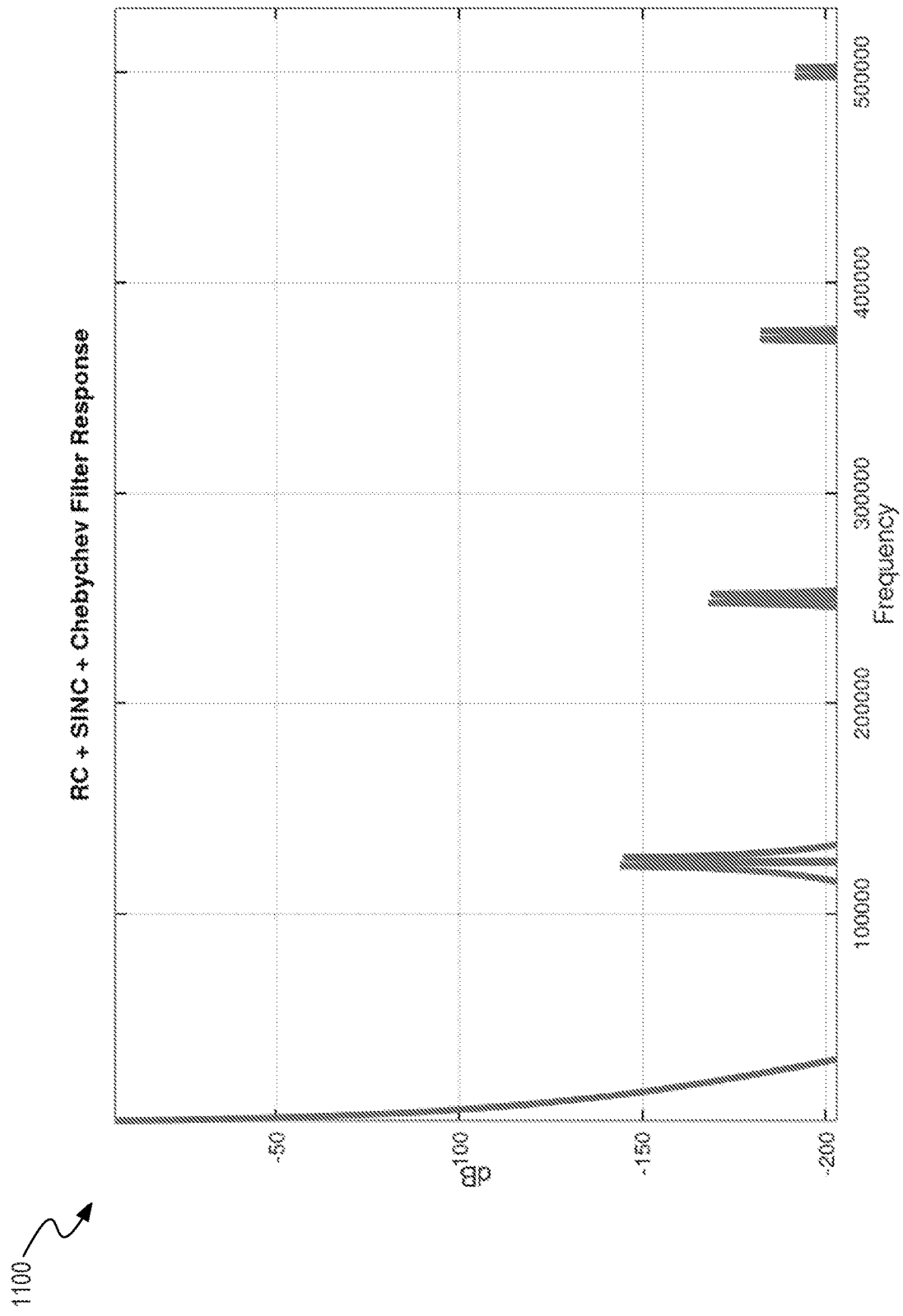
FIG. 11 illustrates an example of a filtered residual current signal after passing through an RC filter, followed by a SINC filter and a Chebyshev low-pass filter.

Graph 1100 of FIG. 11 illustrates an example frequency response of the demodulator (e.g., RC filter, SINC filter, and Chebyshev low-pass filter). As illustrated, aliased high frequency signals of the residual current signal greater than 50 kHz are attenuated by more than 125 dB.

After the residual current signal is filtered in the demodulator 304, what remains is the AC and DC leakage components. Digital information of the AC and DC leakage components may be sent to a microprocessor (not shown) via a communications bus. To isolate the DC component, the output of the Chebyshev low-pass filter 310 is averaged. Taking the root mean square (RMS) of the output of the Chebyshev low-pass filter 310 yields both AC and DC components of the leakage current. The DC components can then be subtracted out if only AC is desired. This calculation process can be accomplished by the same microprocessor that performs the digital signal processing of the preferred embodiment or alternatively it could be forwarded on to a separate microprocessor to perform the remaining calculations.

Figure 12A:
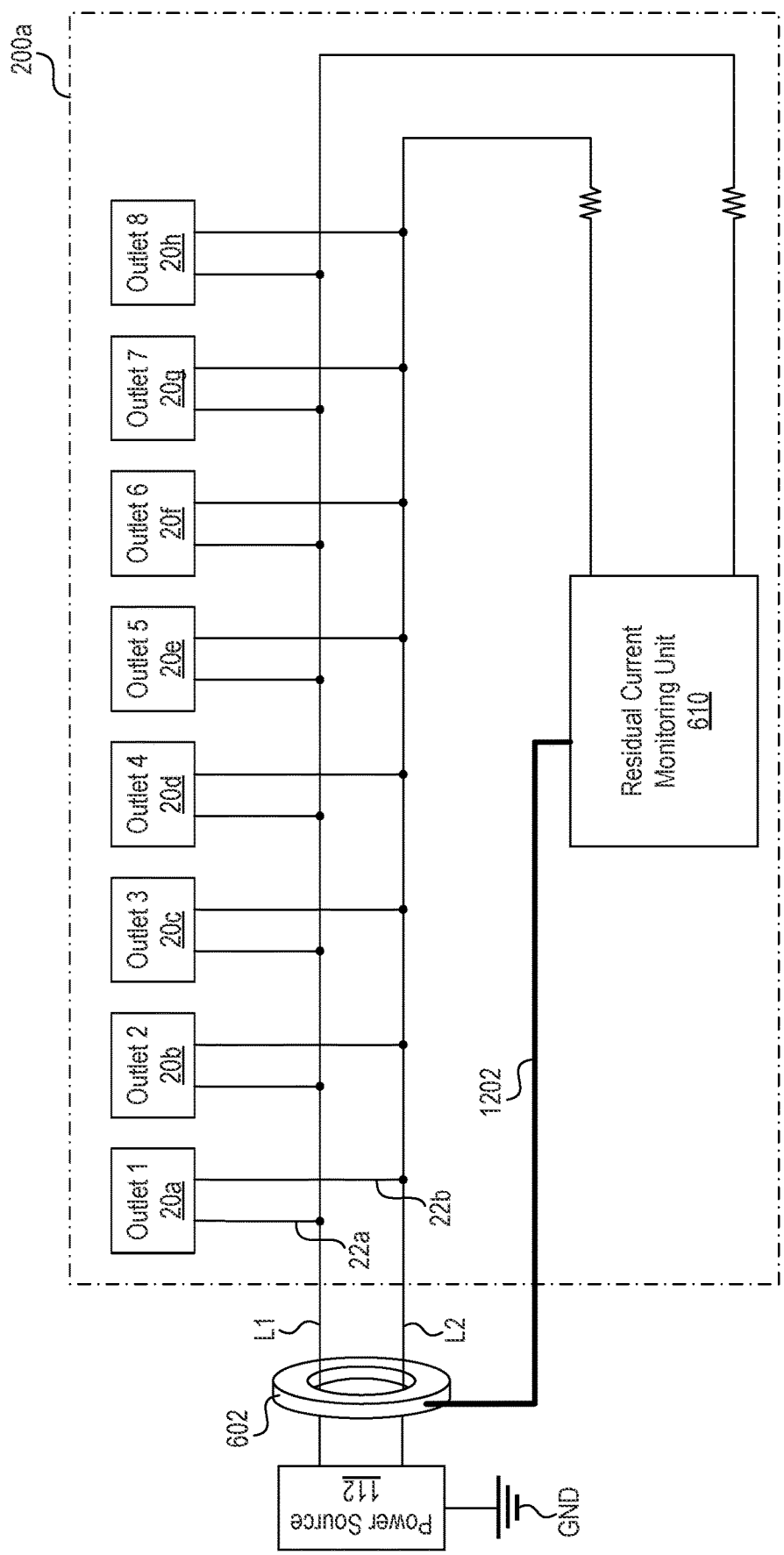
FIG. 12A is a block diagram of one embodiment of an outlet module for use in the PDU of FIG. 1.
Figure 12B:
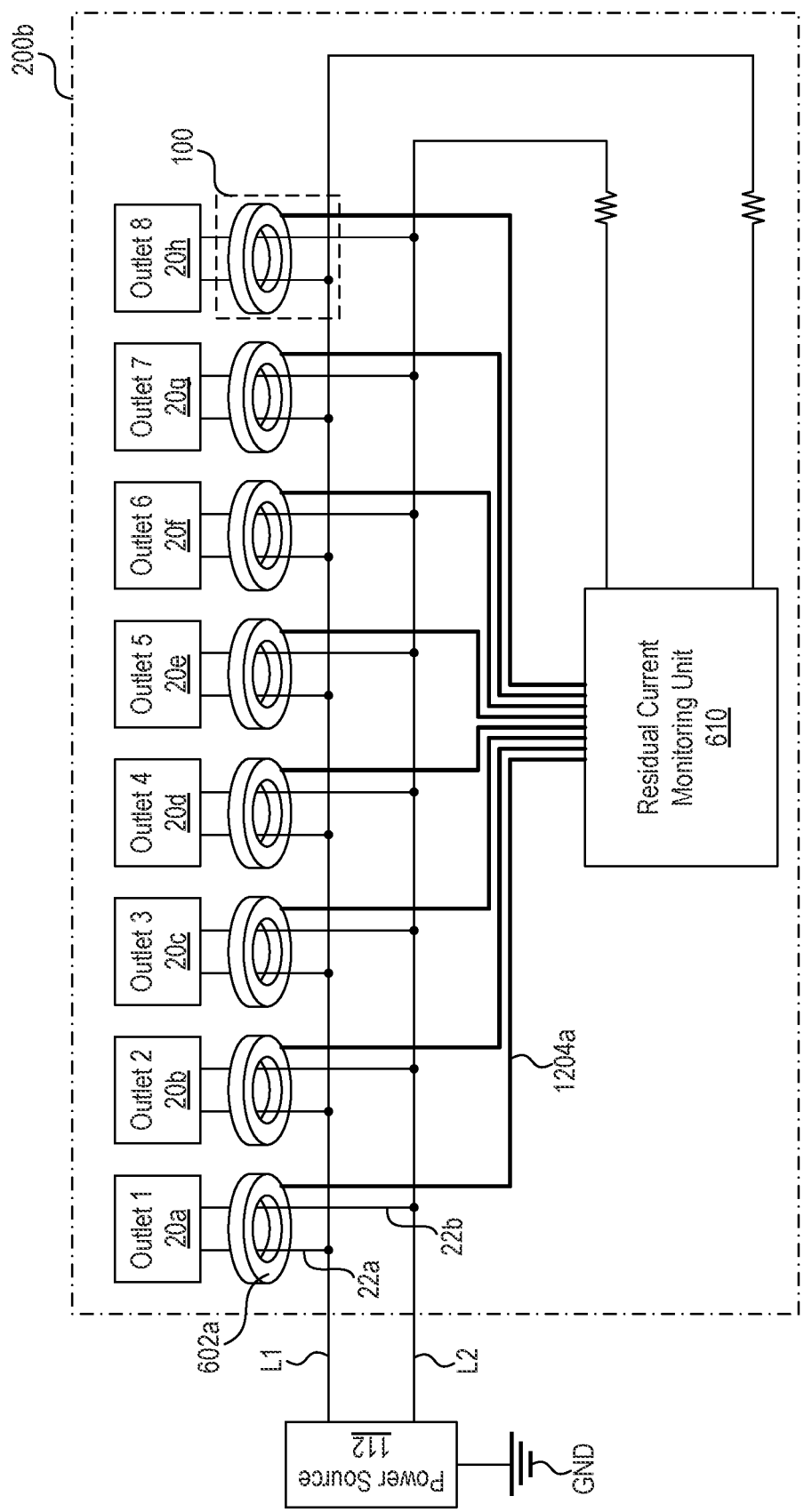
FIG. 12B is a block diagram of another embodiment of an outlet module for use in the PDU of FIG. 1.

Shown in FIGS. 12A-12B are diagrammatic views of representative embodiments of outlet modules 200a and 200b incorporating RCM circuits. FIG. 12A illustrates an approach for detecting leakage current associated with an outlet module 200a. Specifically shown in FIG. 12A is a diagrammatic view of an embodiment of an outlet module 200a electrically connected to two conductors L1, L2 of a power source 112. It should be appreciated then that conductors L1 and L2 could be associated with a PDU having a 3-phase Delta input configuration. As illustrated, conducts L1 and L2 pass through the center of a toroidal core 602 and connect to each of the module's outlets 20a-20h. Though not shown, each outlet 20a-20h is also interconnected to a ground GND in the power source 112. The toroidal core 602 forms part of a residual current monitoring system, such as described above in earlier figures, which may include an on board residual current monitoring (RCM) unit 610 electrically connected to the core 602 via connector bus 1202. To that end, connector bus 1202 may be a collection of wires, namely the driving windings and test winding of the RCM. It can thus be appreciated that outlet module 200a can be used to detect the presence of downstream leakage current that may be associated with any component connected to module 200a via any of its outlets 20a-20h.

FIG. 12B illustrates another embodiment of an outlet module 200b which can be used to detect leakage current on a per-outlet basis. As shown in FIG. 12B, each outlet 20a-20h of module 200b is interconnected to L1 and L2 via conductors 22, such as conductors 22a and 22b associated with outlet 20a. Each outlet 20a-20h also includes an associated toroidal core, such as core 602a, though which conductors 22a and 22b pass, and drive windings (not shown). Residual current monitoring (RCM) unit 610 is electrically connected to the toroidal core 602a. Here again, connection 1204a includes the driving windings and test winding of the RCM. In some embodiments, one or more of outlets 20a-20h may also include dedicated residual current sensing circuit 100, such as described above with reference to FIG. 4A, so that only the filtering of the response signals are handled by RCM unit 610. Of course, the ordinarily skilled artisan will appreciate that the embodiments of FIGS. 12A and 12B could be readily adapted to accommodate PDUs having different power input configurations, such as 3-phase Wye inputs and the like. Also, to accomplish the residual current monitoring, these modules could leverage one or more existing components (e.g., microprocessors) typically associated with outlet modules of this type, such as the intelligent power modules (IPMs) described in co-pending application Ser. No. 17/833,652, filed on Jun. 6, 2022 and entitled "Per Outlet Residual Current Monitoring For Power Distribution Units." Alternatively, dedicated circuitry components could be used.

Those of skill will appreciate that the various illustrative logical blocks, modules, circuits, and algorithm steps described in connection with the embodiments disclosed herein may be implemented as electronic hardware, computer software, firmware, or combinations thereof. To clearly illustrate this interchangeability, various illustrative components, blocks, modules, circuits, and steps have been described above generally in terms of their functionality. Whether such functionality is implemented as hardware, software, and/or firmware depends upon the particular application and design constraints imposed on the overall system. Skilled artisans may implement the described functionality in varying ways for each particular application, but such implementation decisions should not be interpreted as causing a departure from the scope of the present invention.

For a hardware implementation, the processing units may be implemented within one or more application specific integrated circuits (ASICs), digital signal processors (DSPs), programmable logic devices (PLDs), field programmable gate arrays (FPGAs), processors, controllers, microcontrollers, microprocessors, electronic devices, other electronic units designed to perform the functions described herein, or a combination thereof. For a firmware and/or software implementation, the methodologies may be implemented with modules (e.g., procedures, functions, and so on) that perform the functions described herein.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A power distribution unit (PDU) comprising:
an elongate housing;
a power input associated with said elongate housing, said power input including a plurality of power conductors;
a plurality of power outputs electrically connected to said power input for providing power to electrical equipment; and
a residual current monitor (RCM) associated with said power input for detecting a presence of downstream leakage current, said RCM comprising:
a sensor, including:
a core susceptible to magnetization, at least some of said plurality of power conductors intersecting said core;
a plurality of drive windings about said core;
drive circuitry operative to produce alternating drive signals through said plurality of drive windings sufficient to drive said core into and out of positive and negative saturation;
sensing circuitry responsive to said downstream leakage current on said plurality of power conductors corresponding to leakage current to bias at least one of said alternating drive signals and produce a response signal; and
a high-order current signal filter for removing high frequency components of said response signal to isolate characteristics of said downstream leakage current.

2. The PDU according to claim 1, wherein said core is an annular ferromagnetic core and wherein said plurality of drive windings includes a first drive winding wound circumferentially around said annular ferromagnetic core, and a second drive winding wound circumferentially around said annular ferromagnetic core, such that the flux generated by the first drive winding is opposite the flux generated by the second drive winding.

3. The PDU according to claim 2, wherein each of said plurality of drive windings is wound circumferentially around said annular ferromagnetic core with a selected number of turns.

4. The PDU according to claim 2, wherein the PDU includes a test circuit incorporating a third winding.

5. The PDU according to claim 1, wherein said power input is a polyphase input that is configured as either a delta input or a wye input.

6. The PDU according to claim 1, wherein said power input comprises two line conductors or a line conductor and a neutral conductor.

7. The PDU according to claim 1, wherein said high-order current signal filter is at least a $3^{rd}$ order filter that includes an RC filter.

8. The PDU according to claim 1, wherein said high-order current signal filter is at least a $3^{rd}$ order filter that includes a SINC filter.

9. The PDU according to claim 1, wherein said high-order current signal filter is at least a $3^{rd}$ order filter that includes a low-pass filter.

10. The PDU according to claim 1, wherein said drive circuitry includes timing circuitry for controlling said alternating drive signals.

11. A power distribution unit (PDU) comprising:
a housing;
at least one power input associated with said housing, said at least one power input including a plurality of power conductors;
a plurality of power outputs electrically connected to said at least one power input for providing power to electrical equipment; and
a residual current monitor (RCM) associated with said at least one power input for detecting a presence of downstream leakage current, said RCM comprising:
a sensor, including:
a core susceptible to magnetization, at least some of said plurality of power conductors intersecting said core;
a plurality of drive windings about said core;
drive circuitry operative to produce alternating drive signals through said plurality of drive windings sufficient to drive said core into and out of positive and negative saturation;
sensing circuitry responsive to said downstream leakage current on said plurality of power conductors corresponding to leakage current to bias at least one of said alternating drive signals and produce a response signal; and a high-order current signal filter for removing high frequency components of said response signal to isolate characteristics of said downstream leakage current.

12. A power distribution unit (PDU) comprising:

a housing;

a power input including a plurality of power conductors for providing power to components within said PDU;

a plurality of outputs for providing power to electrical equipment; and a residual current monitor (RCM) for detecting a presence of leakage current, said RCM comprising:

a sensor responsive to leakage current to produce a response signal representative of said leakage current, wherein said sensor includes an annular ferromagnetic core surrounding at least some of said plurality of power conductors and at least a pair of drive windings which generate flux about said annular ferromagnetic core in opposite directions, whereby presence of said leakage current, corresponding to a net current on power conductors passing through said annular ferromagnetic core, induces said response signal on said drive windings, wherein said presence of said leakage current affects a duty cycle of said response signal; and a filter operative to isolate characteristics of said leakage current from said response signal.

13. The PDU according to claim 12, wherein said response signal has a 50/50 duty cycle in an absence of said leakage current and a non-50/50 duty cycle or a change in amplitude in the presence of said leakage current.

14. The PDU according to claim 12, wherein said filter is a high-order filter operative to remove high frequency components from said response signal, wherein said high-order filter is at least a $3^{rd}$ order filter that includes an RC filter, a SINC filter, and a low-pass filter.

* * * * *